US008064210B2

(12) United States Patent
Ellis

(10) Patent No.: US 8,064,210 B2
(45) Date of Patent: Nov. 22, 2011

(54) ONE PIECE CARD GUIDE FOR A PRINTED CIRCUIT BOARD

(75) Inventor: James W. Ellis, Livermore, CA (US)

(73) Assignee: Airtronics Metal Products, Inc., San Jose, CA (US)

( * ) Notice: Subject to any disclaimer, the term of this patent is extended or adjusted under 35 U.S.C. 154(b) by 279 days.

(21) Appl. No.: 12/580,219

(22) Filed: Oct. 15, 2009

(65) Prior Publication Data
US 2010/0097773 A1 Apr. 22, 2010

Related U.S. Application Data

(60) Provisional application No. 61/106,037, filed on Oct. 16, 2008.

(51) Int. Cl.
H05K 5/00 (2006.01)
(52) U.S. Cl. .......... 361/756; 439/160; 312/326; 360/88; 235/439
(58) Field of Classification Search .................. 439/630, 439/60, 160, 325, 92, 159; 361/756, 759, 361/801, 679.51, 818, 699; 312/223.2, 326, 312/213, 205, 223.1; 360/31, 97.02, 130.3, 360/88; 248/560, 183.1, 658; 235/50 R, 235/483, 441, 439, 449, 379
See application file for complete search history.

(56) References Cited

U.S. PATENT DOCUMENTS

| | | | |
|---|---|---|---|
| 3,184,069 A | 5/1965 | Rosenberg | |
| 3,563,391 A | 2/1971 | Weltha et al. | |
| 3,664,510 A | 5/1972 | Kerschbaum | |
| 3,696,936 A | 10/1972 | Straccia et al. | |
| 3,714,513 A | 1/1973 | Marconi | |
| 3,760,233 A | 9/1973 | Warwick | |
| 3,829,741 A | 8/1974 | Athey | |
| 3,878,438 A | 4/1975 | Weisman | |
| 3,899,721 A | 8/1975 | Borchard et al. | |
| 4,007,403 A | 2/1977 | Fiege | |
| 4,019,099 A | 4/1977 | Calabro | |
| 4,022,326 A | 5/1977 | Marconi | |
| 4,327,835 A | 5/1982 | Leger | |
| 4,779,744 A | 10/1988 | Shely et al. | |
| 5,016,142 A | 5/1991 | White | |
| 5,445,531 A * | 8/1995 | Billman et al. | 439/160 |
| 5,648,891 A | 7/1997 | Gierut | |
| 5,668,701 A | 9/1997 | Fukai | |

(Continued)

FOREIGN PATENT DOCUMENTS

JP          04309292 A      10/1992

*Primary Examiner* — Hung Duong
(74) *Attorney, Agent, or Firm* — Intellectual Property Law Group LLP

(57) ABSTRACT

A one piece card guide for edge grounding a printed circuit board and guiding the board to a mounted position. The card guide is formed out of a single piece comprising an integrally formed pair of sidewalls facing each other and spaced apart to form a longitudinal slot into which the circuit board is inserted. At least one pair of grounding points is integrally formed into the side walls for contact with an inserted circuit board. The grounding points may be formed as integral spring fingers on opposite sides of the sidewalls to maximize the contact with the circuit board. The card guide allows for different numbers of grounding points in the card guide. The single piece construction of the card guide reduces intermittent contact with circuit cards by providing a guide that ensures continuous edge grounding.

18 Claims, 3 Drawing Sheets

U.S. PATENT DOCUMENTS

| | | | |
|---|---|---|---|
| 5,696,668 A | 12/1997 | Zenitani et al. | |
| 5,708,552 A | 1/1998 | Han et al. | |
| 5,738,226 A | 4/1998 | Dean | |
| 5,805,429 A | 9/1998 | Andersson | |
| 6,269,006 B1 | 7/2001 | Treiber et al. | |
| 6,381,149 B1 | 4/2002 | Megason et al. | |
| 6,396,690 B1 | 5/2002 | Blatti | |
| 6,607,404 B1 * | 8/2003 | Ito et al. | 439/630 |
| 6,728,114 B2 | 4/2004 | Serjack et al. | |
| 6,735,091 B2 | 5/2004 | Megason et al. | |
| 2006/0139895 A1 | 6/2006 | Justason et al. | |
| 2009/0215285 A1 * | 8/2009 | Creasy et al. | 439/60 |
| 2010/0165588 A1 * | 7/2010 | Chan et al. | 361/756 |

* cited by examiner

ONE PIECE CARD GUIDE FOR A PRINTED CIRCUIT BOARD

CROSS-REFERENCE TO RELATED APPLICATIONS

This application claims priority to U.S. provisional patent application no. 61/106,037, filed on Oct. 16, 2008, the entire contents of which are hereby incorporated by reference.

BACKGROUND OF THE INVENTION

1. Field of the Invention

Aspects of the invention relate generally to the field of electrical edge grounding for printed circuit boards and more particularly to an apparatus to guide a printed circuit board or card to a mounted position to engage an edge connector.

2. Background

There exists a need for a printed circuit board card guide that can reduce inconsistencies of the guiding system resulting from use of multiple materials. A need also exists for a printed circuit board card guide that can be manufactured at a lower cost and in a shorter time.

It is well known in the art that printed circuit cards or boards provide for support and interconnection with various electronic components mounted thereon. Conductive strips of material are coated on one side of the printed circuit boards for interconnecting the electronic components.

There exist printed circuit board card guides, such as guides including multiple pieces of copper and electromagnetic interference (EMI) clips. However, existing products are limited in resulting consistency of the guide system and have high manufacturing costs. Unlike the present invention, current products are made out of multiple pieces and dissimilar materials. Multiple piece printed circuit board card guides require a higher cost of manufacturing because each piece has to be installed prior to operation. Furthermore, an additional piece of material increases a chance of failure such as falling off after assembly or during shipping. This causes the problem of leaving no shielding at all. Therefore, there is a need for a solution to remove such problems.

Information relevant to addressing these problems can be found in existing products. However, each existing product suffers from one or more of the following disadvantages: higher manufacturing cost; lack of consistency due to multiple pieces and/or dissimilar materials in a guiding system; insecure connection between pieces; potential intermittent contact by using an many pieces.

The existing products mentioned above are not admitted to be prior art with respect to the present invention by their mention in this Background Section.

SUMMARY OF THE INVENTION

A card guide for a printed circuit board according to an embodiment of the present invention comprises of a single piece card guide for guiding printed circuit boards to a mounted position. This one-piece construction card guide includes a pair of sidewalls facing each other and a longitudinal slot or channel formed between the sidewalls, into which a circuit card can be inserted. The single piece card guide further includes at least one pair of grounding points. The grounding points are located on the sidewalls and are capable of staying in constant contact with the circuit card that is inserted into the card guide.

A grounding point of an embodiment of the present invention comprises a spring finger, which allows consistent contact between mating surfaces even along irregular edges.

In other embodiments of the present invention, there are at least four grounding points on the sidewalls. The card guide is comprised of at least one opening formed through the guide on either side of the longitudinal slot.

Accordingly to another embodiment, there is a printed circuit card rack comprising a plurality of one-piece card guides as described.

In another embodiment, the one-piece card guide is housed in a chassis, an aperture is formed in the card guide body on each side of the longitudinal slot, and at least one grounding point is integrally formed on a section of each sidewall for providing continuous electrical contact with a card inserted into the slot and grounding the card to the chassis.

A method of manufacturing or fabricating a one-piece card guide according to an embodiment of the present invention comprises cutting at least an opening in a sheet of material body suitable for guiding printed circuit boards; forming a middle section in the card guide to have longitudinal sidewalls protruding from the material body and forming a channel between the sidewalls for engaging a printed circuit board; and integrally forming grounding points directly on the sidewalls. The grounding points on the sidewalls may be fabricated of integrally formed spring fingers.

An object of an embodiment of the present invention is to provide for consistency of a guiding system at a lower cost.

An object of an embodiment of the present invention is to provide for EMI shielding at a lower cost compared to conventional edge grounding using copper pieces or clips.

These and other embodiments of the present invention are further made apparent, in the remainder of the present document, to those of ordinary skill in the art.

BRIEF DESCRIPTION OF THE DRAWINGS

In order to fully describe embodiments of the present invention, reference is made to the accompanying drawings. These drawings are not to be considered limitations in the scope of the invention, but are merely illustrative. For example, these drawings illustrate a card guide with four grounding points according to an embodiment of the present invention. The number of grounding points may vary depending on an embodiment of the present invention.

DETAILED DESCRIPTION OF SPECIFIC EMBODIMENTS

The description above and below coupled with the drawings of the present document, focus on one or more currently preferred embodiments of the present invention and also describe some exemplary optional features and/or alternative embodiments. The description and drawings are for the purpose of illustration and not limitation. Those of ordinary skill in the art would recognize variations, modifications, and alternatives. Such variations, modifications, and alternatives are also within the scope of the present invention. Section titles are terse and are for convenience only.

In an embodiment of the present invention, by sliding a printed circuit board/card into the one-piece card guide, two grounding points located on opposite sidewalls make contact with the board to ground the board to a chassis. The number of grounding points may vary—two at a minimum or more. The number of grounding points may depend on a length, width, height and material of a guide. An embodiment of the invention includes four grounding points in the guide. The embodiment includes benefits of saving time and costs due to increased consistency of a guiding system.

In an embodiment of the present invention, a pair of grounding points are located on the opposite sidewalls, facing each other, thus allowing the card to easily and smoothly slide in, regardless of its size or material used.

For the purpose of illustration and not limitation, all the drawings illustrate a card guide with four grounding points according to the present invention.

Figure 1:
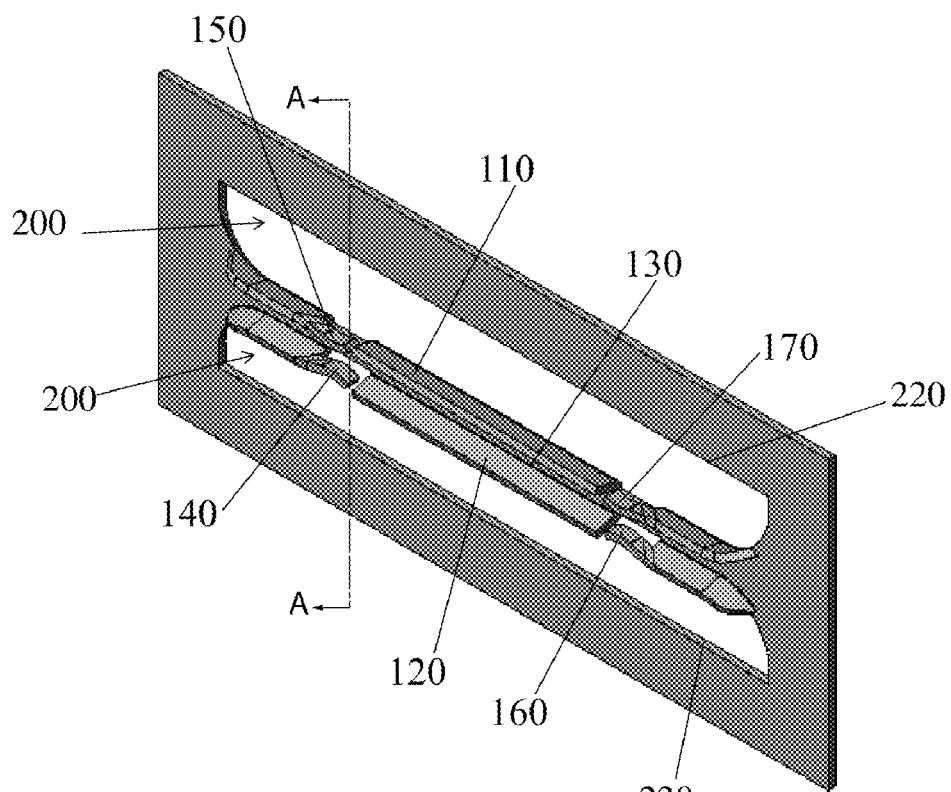
FIG. 1 is a perspective view of a card guide for a printed circuit board according to an embodiment of the present invention.

FIG. 1 is a perspective view of a card guide for a printed circuit board according to an embodiment of the present invention. The card guide is manufactured out of a single piece and no other additional piece is assembled. The card guide of FIG. 1 includes sidewalls 110 and 120 to form a longitudinal slot 130. A circuit card may be mounted in the slot 130 (not shown). Both the top and bottom edge of the circuit card is inserted into the longitudinal slot 130 of two separate card guides.

The card guide of FIG. 1 further includes grounding points 140, 150, 160 and 170. When a circuit card is inserted into a card rack, the edges of the card interferingly engage with the grounding points 140, 150, 160 and 170, thereby holding the top and bottom edges of the card (not shown). In an embodiment of the present invention, the grounding points are spring fingers, which allow continuous electrical contact with the inserted circuit card.

The card guide is manufactured according to a process in which the one-piece card guide is completely constructed from the same piece of non-preplated sheet metal material. The card guide manufacturing process involves soft tooling techniques to form the edge-grounding feature (i.e. grounding points 140-170) of the card guide in conjunction with the card guide itself. The edge-grounding feature (the spring fingers) is punched into the sheet metal, and then the card guide is formed to complete the fabrication process.

In one embodiment of the invention, the sidewalls are constructed with form up card guide tooling in an NC turret punch. Relief openings are created first, thus freeing up space on the flat material from which the sidewalls will be formed up. The construction of the sidewalls creates an aperture 200 (open space/relief opening) above sidewall 110 and below the other sidewall 120. Each aperture inside the card guide is formed by a longitudinal straight edge parallel to a sidewall and a curved edge aligned with a sidewall. In one embodiment of the invention, the transverse distance between a straight edge 220 of the aperture of sidewall 110 and a straight edge 230 of the aperture of sidewall 120 is approximately 0.849 inches. In an embodiment, the length of each straight edge 220, 230 of each aperture on the card guide is approximately 2.875 inches. In an embodiment of the invention, each sidewall, 110, 120 of the card guide has a height H of approximately 0.103 inches (see FIG. 2C).

At least two grounding points are integrally formed from the sidewalls, from the same material, as spring fingers to securely hold the edge of card and thereby provide continuous contact. In this embodiment, the longitudinal distance between the midpoints of two spring finger grounding points along the same sidewall, for instance points 140 and 160, is approximately 1.50 inches. Accordingly, the longitudinal distance along the straight edge from each distal end of the straight edge to said midpoint of its spring finger on the same sidewall is approximately 0.688 inches on each side. Such a configuration for the spring finger design according to the embodiment provides for a required repeatable force on a circuit board once inserted into the guide. The specific lengths, widths, heights and size of these components of the one-piece card guide are not limited and can be adjusted as needed to suit the requirements for the size of the card guide and printed circuit board.

In one embodiment of the invention, the materials used to manufacture the card guide comprise of non-preplated materials selected from a group including but not limited to, 0.036 cold rolled steel, clear Zinc, and bright nickel.

Figure 2A:
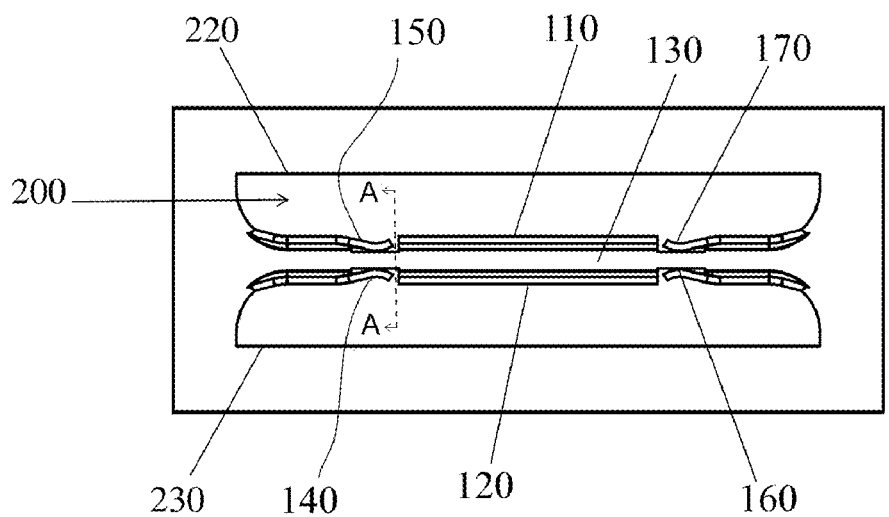
FIG. 2A is a top view of the card guide of FIG. 1 according to an embodiment of the present invention.
Figure 3:
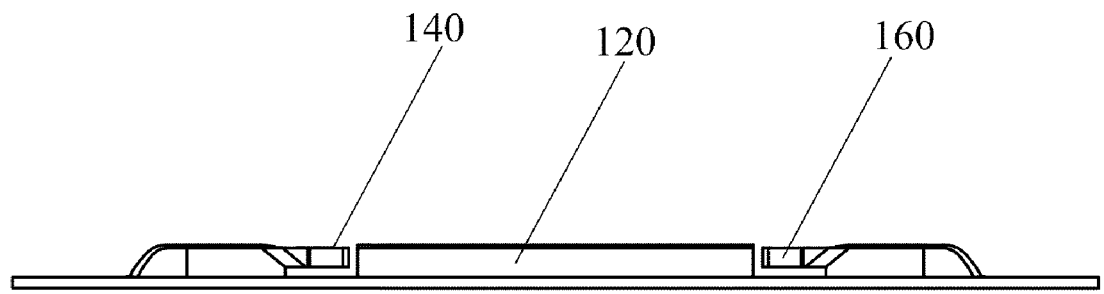
FIG. 3 is a side view of a card guide of FIG. 1 according to an embodiment of the present invention.

FIGS. 2A and 3 illustrate different views of the card guide of FIG. 1 according to an embodiment of the present invention. FIG. 2A is a top view of the card guide of FIG. 1 and FIG. 3 is a side view of the card guide of FIG. 1.

Figure 2B:
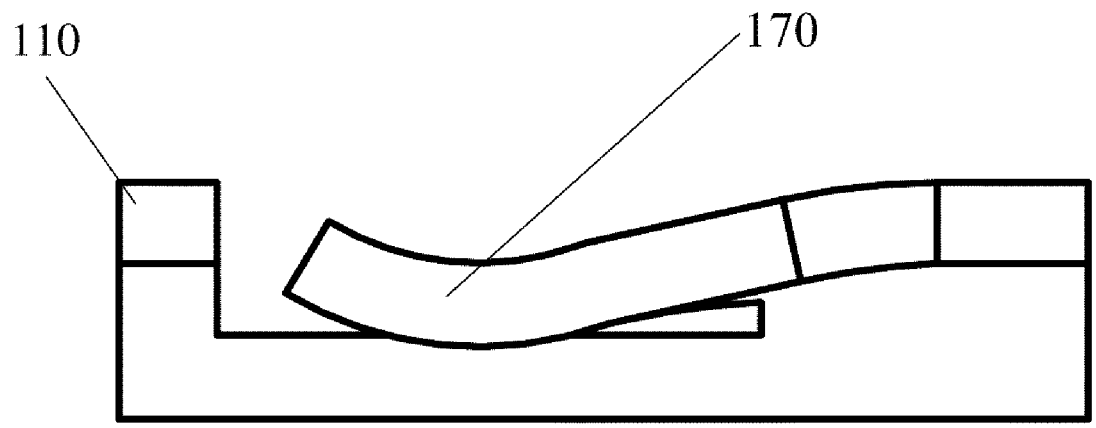
FIG. 2B is an enlarged fragmentary view of the grounding point 170 of the card guide of FIG. 1, which interferingly engages an edge of a printed circuit board card, according to an embodiment of the present invention.

FIG. 2B is an enlarged fragmentary view of the grounding point 170 of sidewall 110 of the card guide of FIG. 1 as shown in FIG. 2A, according to an embodiment of the present invention. The grounding point 170 interferingly engages the edge of a card inserted into the slot 130.

Figure 2C:
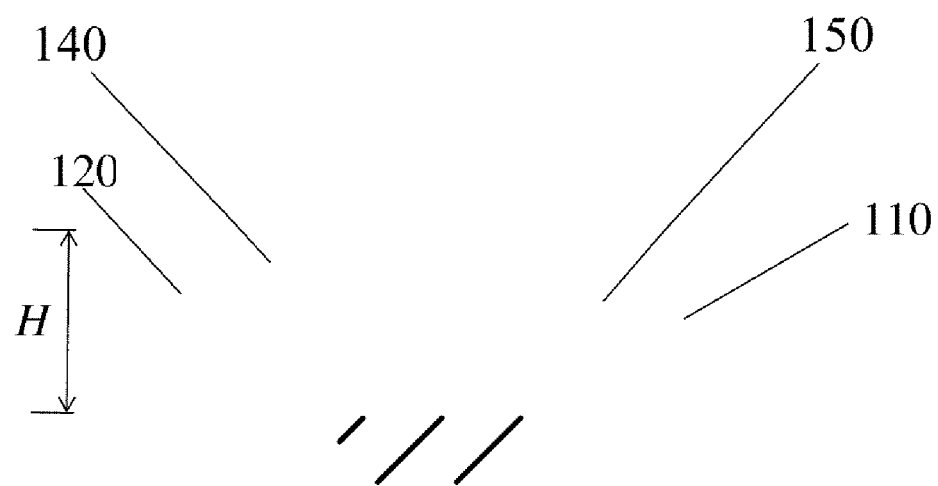
FIG. 2C is a longitudinal cross-sectional partial view along line A-A of a card guide of FIG. 1 and FIG. 2A, according to an embodiment of the present invention.

FIG. 2C is a longitudinal cross section partial view (section A-A of FIG. 2A) of a card guide of FIG. 1 according to an embodiment of the present invention. The dotted line of FIG. 1 and also shown in FIG. 2A is for the A-A cutting plane facing the grounding points 140 and 150 of each sidewall 120 and 110 respectively. Each sidewall shown to be formed having a height H.

Figure 4:
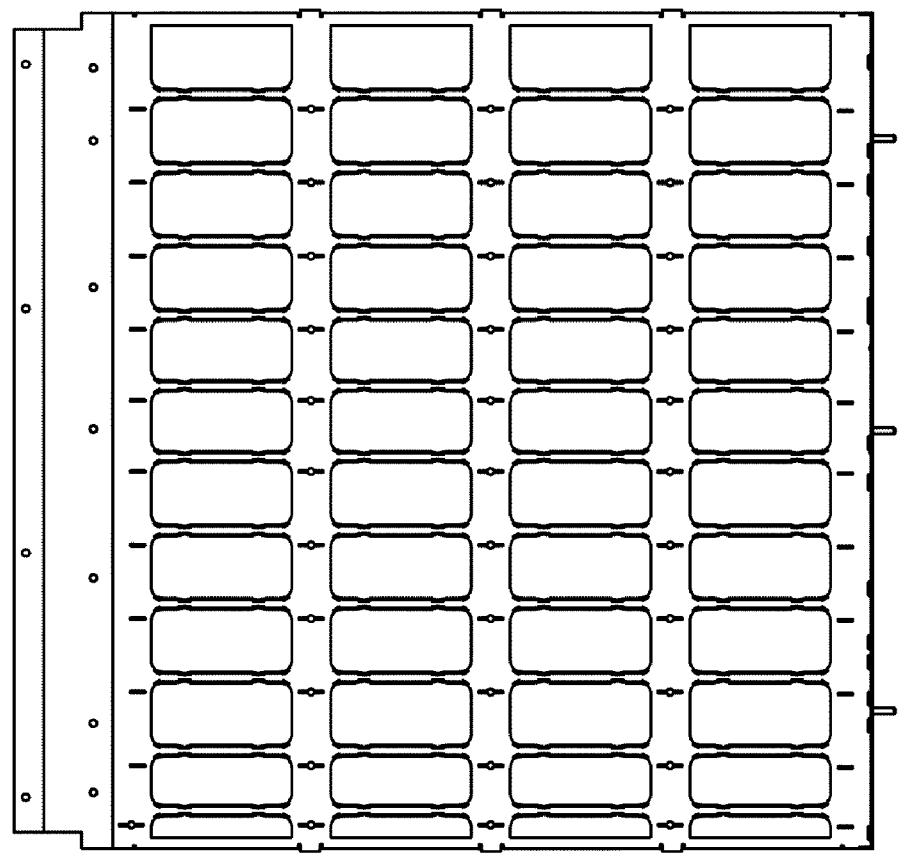
FIG. 4 is a top view of a printed circuit card rack equipped with multiple card guides according to an embodiment of the present invention.

FIG. 4 is a top view of a printed circuit card rack equipped with multiple card guides according to an embodiment of the present invention. A plurality of the card guides of FIG. 1 are mounted on a rack in a spaced relationship to receive circuit cards. Only representative card guides of FIG. 1 are shown in FIG. 4 so that the figure may be simplified and so that the general rack and guides may be seen.

Although the present invention has been described in considerable detail with reference to certain preferred version, other versions are possible. For example, any number of grounding points may be added which may differ from the drawings shown. Throughout the description and drawings, example embodiments are given with reference to specific configurations. It will be appreciated by those of ordinary skill in the art that the present invention can be embodied in other specific forms. Those of ordinary skill in the art would be able to practice such other embodiments without undue experimentation. The scope of the present invention, for the purpose of the present patent document, is not limited merely to the specific example embodiments or alternatives of the foregoing description.

I claim:

1. A one-piece card guide for edge grounding a printed circuit card to a mounted position, the one-piece card guide comprising:
    a card guide body having a surface, at least two longitudinally displaced opposing sidewalls integrally protruding from the surface;

a longitudinal slot formed between the two sidewalls configured to receive an edge of the card; and at least one grounding point integrally formed on a section of each sidewall providing continuous electrical contact with the card inserted into the longitudinal slot.

2. The one-piece card guide of claim 1, wherein each grounding point is an integrally formed spring finger.

3. The one-piece card guide of claim 1, wherein the at least one grounding point on each sidewall are located opposing each other.

4. The one-piece card guide of claim 1, comprising at least four grounding points wherein two of the grounding points are positioned on one of the sidewalls and opposite to the other two grounding points on the opposing sidewall.

5. The one-piece card guide of claim 1, further comprising a first opening formed in the body located on one side of the longitudinal slot and a second opening formed in the body located on another side of the slot.

6. The one-piece card guide of claim 5, wherein each opening has a parallel edge to the longitudinal slot and wherein a transverse distance from a farthest parallel edge of the first opening to a farthest parallel edge of the second opening is about 0.85 inches.

7. The one-piece card guide of claim 6, wherein each farthest parallel edge of an opening has a length of approximately 2.875 inches.

8. A printed circuit card rack for guiding a plurality of cards to a mounted position comprising a plurality of one-piece card guides, each one-piece card guide comprising:

a card guide body having a surface, at least two longitudinally displaced opposing sidewalls integrally protruding from the surface;

a longitudinal slot formed between the two sidewalls configured to receive an edge of the card; and at least one grounding point integrally formed on a section of each sidewall providing continuous electrical contact with the card inserted into the longitudinal slot.

9. The card guide system of claim 8, wherein each grounding point is an integrally formed spring finger.

10. The card guide system of claim 8, wherein the at least one grounding point on each sidewall are located opposing each other.

11. The card guide system of claim 8, further comprising an opening formed in the body located on one side of the longitudinal slot and a second opening formed in the body located on another side of the slot.

12. A method of fabricating a one-piece card guide, the method comprising:

cutting at least two apertures in a sheet of material body, leaving a solid section in a middle portion of the body;

punching the middle section and forming longitudinal sidewalls protruding away from a surface of the material body such that a longitudinal slot between the sidewalls is formed; and simultaneously during punching of the sidewalls, integrally forming from the material body of the sidewalls, at least one grounding point on each sidewall wherein the grounding points provide continuous electrical contact with a printed circuit board card inserted into the longitudinal slot.

13. The method of manufacturing a one-piece card guide of claim 12, wherein the at least one grounding point on each sidewall is punched out forming an integral spring finger.

14. The method of manufacturing a one-piece card of claim 12, wherein the at least one grounding point on each sidewall are located opposing each other.

15. A one-piece printed circuit card guide housed in a chassis, the card guide comprising:

a card guide body having a surface, at least two longitudinally displaced opposing sidewalls integrally protruding from the surface;

a longitudinal slot formed between the two sidewalls configured to receive an edge of the card;

an opening formed in the body located on one side of the longitudinal slot and a second opening formed in the body located on another side of the slot; and at least one grounding point integrally formed as a spring finger on a section of each sidewall providing continuous electrical contact with the card inserted into the longitudinal slot and grounding the card to the chassis, the spring finger exerting force on the inserted card to stabilize the card in place with the guide.

16. The one-piece card guide of claim 15, wherein the at least one grounding point on each sidewall are located opposing each other.

17. The one-piece card guide of claim 15, comprising at least four grounding points wherein two of the grounding points are positioned on one of the sidewalls and opposite to the other two grounding points on opposing sidewall.

18. The one-piece card guide of claim 15, wherein a height H of each sidewall is approximately 0.103 inches.

* * * * *